(12) United States Patent  
Asano et al.

(10) Patent No.: US 6,574,115 B2  
(45) Date of Patent: Jun. 3, 2003

(54) COMPUTER SYSTEM, ELECTRONIC CIRCUIT BOARD, AND CARD

(75) Inventors: Takeshi Asano, Atsugi (JP); Kazuo Fujii, Yokohama (JP); Masaki Oie, Sagamihara (JP); Hideyuki Usui, Chigasaki (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/682,718

(22) Filed: Oct. 10, 2001

(65) Prior Publication Data

US 2002/0051346 A1 May 2, 2002

(30) Foreign Application Priority Data

Oct. 26, 2000 (JP) ......................................... 2000-326906

(51) Int. Cl.[7] ................................................. H01R 9/00
(52) U.S. Cl. ........................ 361/775; 361/752; 361/675; 174/99 B; 174/71 B
(58) Field of Search ................................. 361/760, 775, 361/792, 799, 827, 684, 719, 748, 752, 800, 730, 675; 257/99; 174/72 B, 71 B, 99 B, 129 B, 70 B

(56) References Cited

U.S. PATENT DOCUMENTS

| | | | | | |
|---|---|---|---|---|---|
| 5,795,162 | A | * | 8/1998 | Lambert ...................... | 333/260 |
| 5,816,826 | A | * | 10/1998 | Colemen ...................... | 439/64 |
| 6,081,430 | A | * | 6/2000 | La Rue ........................ | 361/229 |
| 6,097,612 | A | * | 8/2000 | Ishikawa et al. ............. | 361/794 |
| 6,287,132 | B1 | * | 9/2001 | Perino et al. ................ | 439/108 |
| 6,297,779 | B1 | * | 10/2001 | Tsai ............................ | 343/702 |
| 6,392,160 | B1 | * | 5/2002 | Andry et al. ................ | 174/261 |

* cited by examiner

*Primary Examiner*—Jayprakash N. Gandhi  
*Assistant Examiner*—Hung Bui  
(74) *Attorney, Agent, or Firm*—Anthony J. Canale

(57) ABSTRACT

There are provided motherboard 7, signal line 12 formed on motherboard 7, multiple ground lines 13 formed spaced apart and substantially in parallel with each other adjacent signal line 12, card board 10, signal line 14 formed on card board 10, multiple ground lines 15 formed spaced apart and substantially in parallel with each other adjacent signal line 14, and line connector 9, and signal line 12 and signal line 14 are connected by conductor 16 in connector 9, while ground lines 13 and ground lines 15 are connected by conductor 17 in connector 9. Radio frequency module 11 is connected to signal line 14, and signal line 12 is connected to an antenna through radio frequency receptacle 8. A radio frequency signal is transmitted through signal line 12, conductor 16, and signal line 14 with a low insertion loss.

9 Claims, 7 Drawing Sheets

PRIOR ART

COMPUTER SYSTEM, ELECTRONIC CIRCUIT BOARD, AND CARD

BACKGROUND OF THE INVENTION

1. Field of the Invention

The present invention relates to a computer system, a PC card, and a connecting structure between the PC card and the computer system. More particularly, the invention relates to a technique that is effectively applied to a connecting structure between the PC card for wireless LAN and an antenna in the computer system.

2. Background

Recently, as the use of the Internet or corporate intranet spreads, a means for connection with a communication network such as a telephone network or LAN (local area network) is becoming essential to PC (personal computer) users. Specifically, attention is focused on the wireless communication technology using wireless LAN, which can make the best possible use of the portability characteristic of notebook PCs. Against the background of this, notebook PCs capable of wireless communication which have antennas previously mounted in their housings are now being received in the market.

The notebook PC capable of wireless communication is designed, for instance, so that a slit antenna (aperture antenna) is previously provided in its housing, for instance, in the rear side of a liquid crystal display panel, enabling a wireless LAN card (wireless module) to be added as an option when desired by the user. The optional wireless LAN card provides a design that can reduce the initial price and flexibly to meet the user's needs.

A wireless LAN card compliant with, for instance, the mini PCI (peripheral component interconnect) bus standard can be employed. The mini PCI bus standard adds an expansion card to the PCI bus, and it enables about a 60% reduction in size compared with the conventional PCI card thereby contributing to miniturization and cost-reduction. Alternatively, a card compliant with the PCMCIA (personal computer memory card international association) standard may be used.

However, there is the following problem for the wireless module to be built in the mini PCI standard card slot. That is, to efficiently transmit a weak radio frequency signal such as that of a mobile phone or wireless LAN, the antenna and the wireless module are connected by a cable, and it is required to establish impedance matching between the antenna and the cable and between the cable and the wireless module. For the wireless LAN, a coaxial cable is essential as the cable because the frequency used is in a 2.5 GHz band. FIG. 6 illustrates the problem of connecting the wireless module and the antenna. FIG. 6(a) is a plan view showing part of a wireless module and a motherboard, and FIG. 6(b) shows a cross section of a notebook PC. Coaxial cable 101 LED from antenna 100 is connected to the upper surface side of motherboard 102 by coaxial connector 103. Coaxial connector 103 is connected to coaxial connector 104 through a conductor passing through motherboard 102, and connected to coaxial cable 105. The other end of coaxial cable 105 is connected to coaxial connector 107 on card board 106 of the wireless module, and connected to radio frequency module 109 through wiring 108. With such connection, a complete shield is provided between the output end of the wireless module and the antenna, and in addition, impedance matching can be provided using standard cables and connectors.

However, the spatial limit allowed by the mini PCI standard is 2.4 mm for the component height and 5 mm for the whole card thickness. It is required to use a coaxial connector fulfilling such spatial limit to connect the wireless module and the coaxial cable. In FIG. 6, such a condition is required at least for coaxial connector 107.

In the state of the art, two types of connectors are known as coaxial connectors satisfying the above spatial condition. One is a coaxial connector made by a cutting process, and the other one is a coaxial connector made by a pressing process. The connector made by a cutting process is characterized by easy attachment and detachment, though it is expensive. The connector made by a pressing process is characterized by requiring a large mating and unmating force and hence a special tool for attachment or detachment, though it is inexpensive.

When applying these connectors in products, low cost is a large motivation for adoption. Accordingly, it is desirable to employ the product by pressing. However, when the cable management as shown in FIG. 6 is employed, a special tool is required for installing the wireless module. For the service of installing the wireless module when it is shipped from the factory, it is necessary to distribute the special tool to perform the installation work. There is a problem that a customer not having the special tool cannot perform the installation by himself in the setup at the customer's site after buying a computer.

Although it is possible to directly connect the cable to card board 106, bypassing motherboard 102, as shown in FIG. 7, it may be obvious that it does not lead to a solution of the above described problem.

On the other hand, it is possible to transmit a radio frequency signal through line-type connector 110 to be connected to the edge terminal of card board 106, without employing the cable management as in FIG. 6. However, no consideration is usually given to impedance matching in the connection between the card terminal and line-type connector 110, and thus there is a problem that the signal attenuation (insertion loss) in the connector portion is significant.

BRIEF SUMMARY OF THE INVENTION

It is an object of the present invention to provide a radio frequency transmission technique which realizes, in the standard for expansion cards such as the existing mini PCI, impedance matching performance equivalent to the connection made by a coaxial connector at low cost and with high workability.

The invention of this application is briefly described as follows. That is, the computer system of the present invention consists of a first board, a first signal line formed on the first board, a plurality of first ground lines formed adjacent the first signal line, in spaced and parallel relation to each other, a second board, a second signal line formed on the second board, a plurality of second ground lines formed adjacent the second signal line, in spaced and parallel relation to each other, and a connecting structure for connecting the first board and the second board, the connecting structure electrically connecting the first ground lines and the second ground lines, and electrically connecting said first signal line and the second signal line.

The above connecting structure has a first construction in which the connecting structure is a connector, which is disposed on the first board and has an opening into which part of the second board is inserted, or a second construction in which the connecting structure includes a first connector disposed on the first board, and a second connector disposed on the second board and inserted into the first connector, or a third construction in which the connecting structure is ball bumps or pin terminals arranged in a grid on the second board.

Further, the computer system of the present invention can have the first signal line and the second signal line in multiple numbers, and the first signal lines and the first ground lines may be alternately disposed, and the second signal lines and the second ground lines may be alternately disposed.

Further, the computer system of the present invention has a radio frequency module on the second board, and the second signal line is connected to the radio frequency terminal of the radio frequency module, the multiple number of second ground lines are connected to the ground terminals of the radio frequency module, and a radio frequency signal is transmitted through the first signal line, connecting structure, and second signal line.

Further, the computer system of the present invention has a coaxial receptacle on the first board, and the central conductor of the coaxial receptacle is connected to the first signal line, the outer conductors of the coaxial receptacle are connected to the multiple number of first ground lines, and into the coaxial receptacle is a coaxial plug at an end of a coaxial cable, the other end of which is connected to an antenna structure.

Further, the coaxial receptacle and the coaxial plug are made by a pressing process, and the height of the first board in the direction of the normal thereto can be made about 2.4 mm or lower when they are connected together.

In accordance with the computer system of the present invention, the computer system does not have a coaxial connector on the second board provided with a radio frequency module, and a radio frequency signal is transmitted through the connecting structure by which the second board is connected to the first board. This allows the installation of the second board to be easily made when shipped from the factory, or at the customer's site. On the other hand, the transmission of the radio frequency signal through the connecting structure is carried out by the signal lines on the first and second boards and a multiple number of ground lines which are disposed in parallel adjacent the signal lines. In accordance with the examination by the present inventors, even if the connecting structure and the signal lines, which are the input and output of the connecting structure, are not completely shielded, impedance matching can be provided to the extent that there is no problem in practical use, by employing a coplanar structure sandwiching the signal lines with the ground lines.

DETAILED DESCRIPTION OF THE INVENTION

Now, the embodiment of the present invention is described according to the accompanying drawings. However, the present invention can be carried out in many different modes, and it should not be construed as being limited to the contents described in this embodiment. The same elements are to be assigned the same numerals throughout the embodiment.

Figure 1:
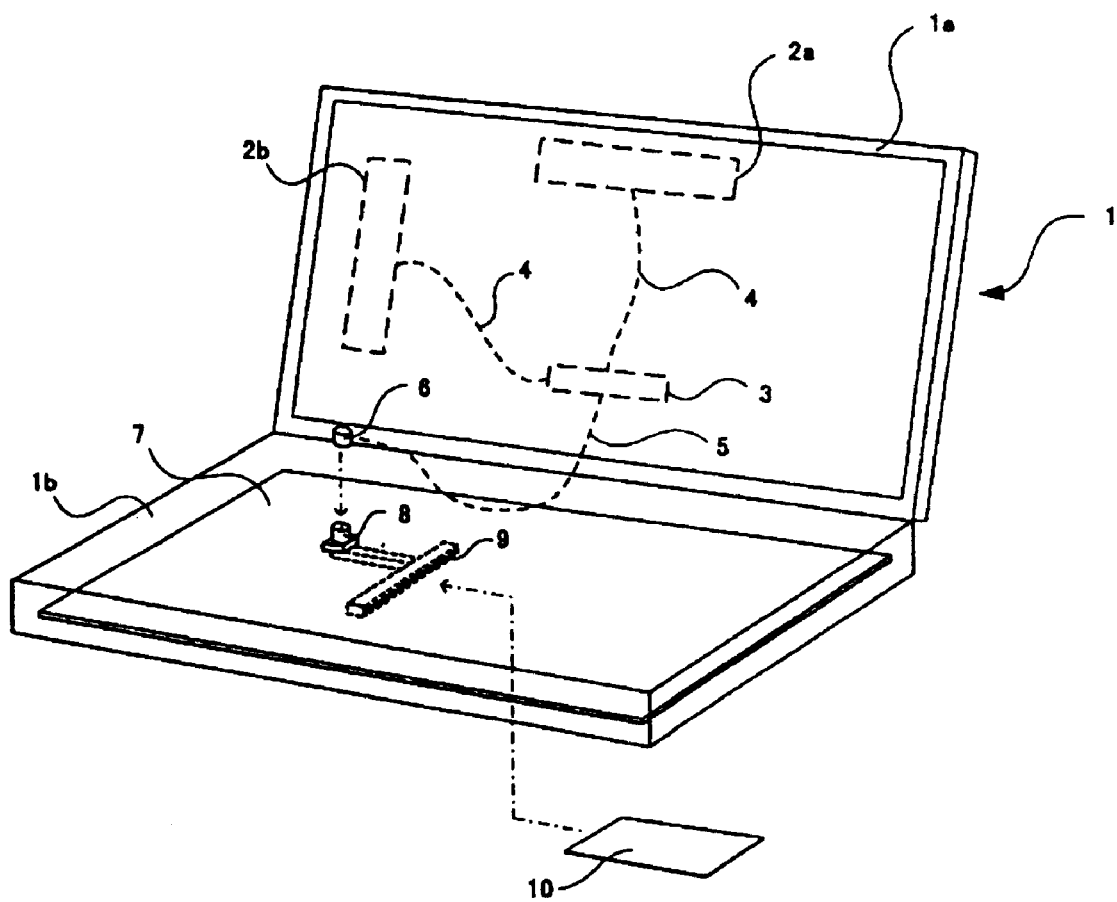
FIG. 1 is an illustration showing an example of the computer system that is an embodiment of the present invention.

FIG. 1 is an illustration showing an example of the computer system of the present invention. The computer system of this embodiment is a notebook computer system. Computer system 1 comprises lid section 1a housing a liquid crystal display device, its peripheral circuit, a backlight, etc., and main body section 1b housing a motherboard, a keyboard, a hard disk drive, a CD-ROM drive, a floppy disk drive, etc.

The housings of lid section 1a and main body section 1b are formed, for instance, from a resin such as ABS. In lid section 1a, for instance, between the housing and the backlight, antennas 2a and 2b are disposed. Antennas 2a and 2b are aperture antennas having a rectangular opening made in a conductor plate, for instance, of copper. Antennas 2a and 2b are arranged in the vertical and horizontal directions, respectively, to accommodate vertically polarized waves and horizontally polarized waves. Which antenna is selected is determined by switcher 3 according to the intensity of received radio waves. Antennas 2a and 2b and switcher 3 are connected by coaxial radio frequency cable 4. Although the aperture antenna is exemplified above, the present invention is not limited to this. Other antennas, for instance, dipole antenna or folded antenna may be employed. Further, there is no particular necessity for disposing two antennas. Switcher 3 is not an indispensable constituent feature of the present invention, though a structural example having switcher 3 has been described. Furthermore, the antennas can be disposed at any position. They may be disposed on the sides of lid section 1a, or on the sides or bottom surface of main body section 1b.

Coaxial radio frequency cable 5 is connected to switcher 3, and it is conducted into main body section 1b. Coaxial radio frequency plug 6 is connected to the other end of radio frequency cable 5. Motherboard 7 is provided in main body section 1b, and coaxial radio frequency receptacle 8 is disposed on the upper side of motherboard 7. Further, on the rear side of motherboard 7, there is arranged line connector 9 of the type into which the edge of card board 10 is inserted. Into line connector 9, part of card board 10 is inserted, as shown.

Radio frequency cables 4 and 5 are formed with a size and material based on the standard. Radio frequency cables 4 and 5 are desired to be as thin as possible, but any thickness is allowed. The characteristic impedance of radio frequency cables 4 and 5 is 50 W or 75 W for instance. Although, in FIG. 1, it is depicted that radio frequency cable 5 is passing through the central portion of lid section 1a and main body section 1b, it may pass through any portion. For instance, it may pass through the hinge portion at both ends of lid section 1a and main body section 1b.

Radio frequency plug 6 and radio frequency receptacle 8 are coaxially formed, the central conductor and outer conductor are electrically connected, respectively. Further, the material and size of the dielectric between the central conductor and the outer conductor are adjusted so that the characteristic impedance is 50 W or 75 W. Radio frequency plug 6 and radio frequency receptacle 8 are made by a pressing process, so they can be made at low cost. Although radio frequency plug 6 needs a special tool when it is mounted or removed, the mounting is already performed when the computer system is assembled, and on the other hand, it is not necessary to insert or withdraw radio frequency plug 6 when the radio frequency module (card board 10) is added. Accordingly, the addition of the radio frequency module (card board 10) only requires insertion into connector 9 which can be very easily carried out. Further, the height is 2.4 mm or lower when radio frequency plug 6 and radio frequency receptacle 8 are connected together. Thus, high-density mounting can be realized.

Elements such as a CPU, a memory device, and memory management chip set are mounted on motherboard 7, though not shown.

Figure 2:
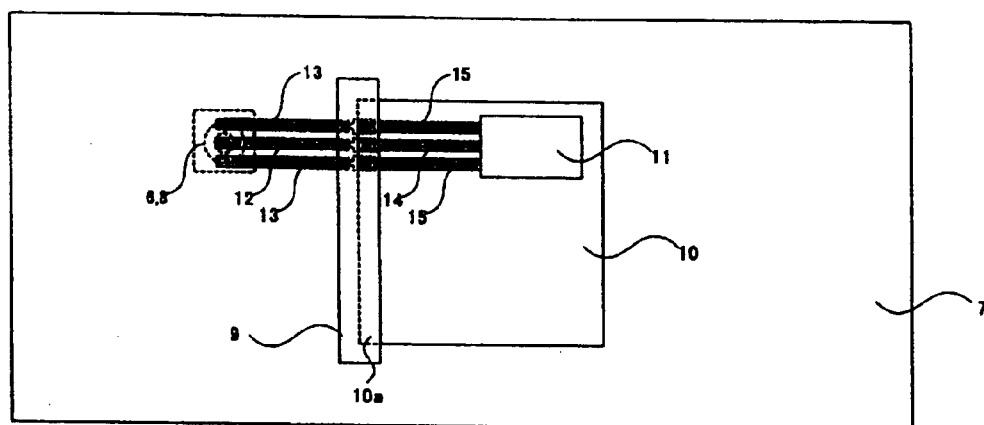
FIG. 2 is a diagram showing a state in which the radio frequency plug is attached to the radio frequency receptacle, and the card board is attached to the line connector.
Figure 2:
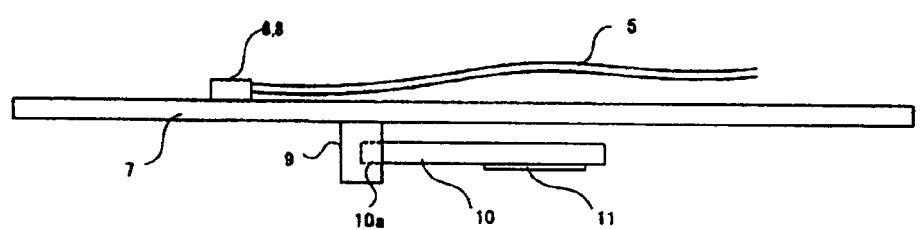

FIG. 2 shows the condition that radio frequency plug 6 is attached to radio frequency receptacle 8 and card board 10 is attached to line connector 9. FIG. 2(a) is a plan view when motherboard 7 is viewed from the rear side, and FIG. 2(b) is a side view.

As shown in FIG. 2, radio frequency plug 6 is attached to radio frequency receptacle 8 on motherboard 7, and radio frequency cable 5 (to be connected to the antenna) is connected to radio frequency plug 6. Formed on motherboard 7 is a wiring consisting of a metal thin film such as copper, which includes signal line 12 and ground lines 13. More wiring is formed, though not shown. Signal line 12 is disposed so as to be sandwiched between ground lines 13, as shown, and signal line 12 and ground lines 13 are disposed substantially in parallel with each other. Although it has been described above that they are disposed in parallel with each other, they need not be disposed geometrically parallel in the strict sense, and a deviation is tolerated to the extent that a short circuit does not occur between them. Further, signal line 12 and ground lines 13 need not be accurately shaped in a rectangle, but they may have, for instance, a wave, curve, or the like. However, even in such case, it is required that both sides of signal line 12 be surrounded by ground lines 13.

Signal line 12 and ground lines 13 are connected to the conductors in line connector 9, and through those conductors, are connected to signal line 14 and ground lines 15 on card board 10, respectively.

Signal line 14 is disposed in a substantially parallel structure in which it is sandwiched by ground lines 15, as is signal line 12. Further, signal line 14 and ground lines 15 need not strictly be parallel with each other, and they may have a wave, curve, or the like, as in the case of signal line 12 and ground lines 13. Signal line 14 is connected to the signal output of radio frequency module 11, and ground lines 15 are connected to the ground outputs of radio frequency module 11.

Figure 3:
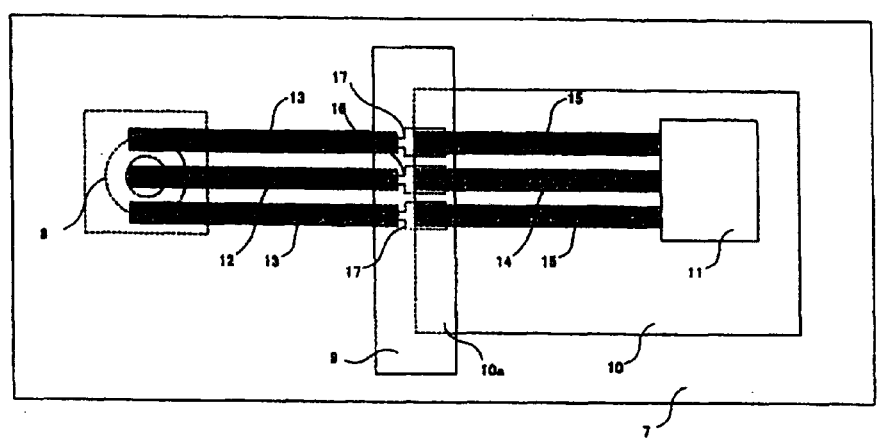
FIG. 3 is a diagram showing the main part of FIG. 2 in more detail, in which (a) is a plan view and (b) is a cross-sectional view.
Figure 3:
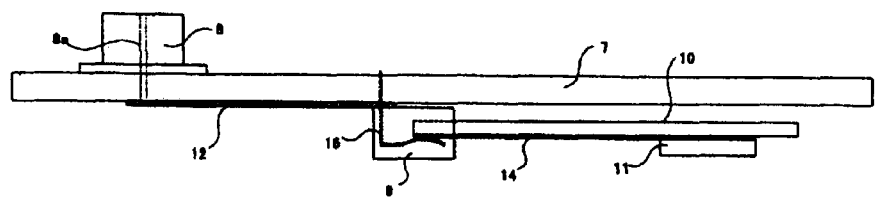

FIG. 3 includes a plan view (a) and a cross-sectional view (b) which show the main part of FIG. 2 in more detail. In line connector 9, conductor 16 is formed consisting of a metal, and through conductor 16, signal line 12 on motherboard 7 is connected to signal line 14 on card board 10. Similarly, ground lines 13 on both sides of signal line 12 are connected through conductors 17 to ground lines 15 on both sides of signal line 14.

Thus, in this embodiment, radio frequency module 11 on card board 10 and radio frequency receptacle 8 on motherboard 7 are connected by signal line 12, conductor 16 of line connector 9, and signal line 14. And signal line 12, conductor 16, and signal line 14 are surrounded by ground lines 13, conductors 17, and ground lines 15. That is, the portion that can not be shielded by the radio frequency cable and the connector (plug and receptacle) forms a striped coplanar structure by the ground lines and the signal lines surrounded by the ground lines. Accordingly, the radio frequency signal transmitted through signal line 12, conductor 16, and signal line 14 is given an effective shield by ground lines 13, conductors 17, and ground lines 15, and the signal attenuation over this section can be reduced to the extent allowed in practical use. That is, the impedance matching can be eventually established in a practical range. The insertion loss values measured by the present inventors are described as follows. That is, in this embodiment, the insertion loss at 2.45 GHz was −0.5 dB. For the purpose of comparison, the insertion loss was −3.5 to −6.4 for the case in which a coplanar structure like this embodiment was not employed, that is, a signal line and a single ground line were disposed merely in parallel with each other. It is seen that an improvement of about 3 dB or more has been accomplished by this embodiment.

Further, the radio frequency signal is transmitted from motherboard 7 through line connector 9 as described above. Thus, it is not needed to connect a radio frequency plug to card board 10, and even if a connector made by a pressing process is employed for the radio frequency plug and receptacle, the magnitude of the force for mating or unmating the plug in the installation of the card is not disadvantageous. That is, by this embodiment, the card installation can be facilitated and the insertion loss of the signal can be made lower.

In the above embodiment, description has been made to an example of the connecting structure of the type in which the edge of the card board is inserted into the line connector, for instance, mini PCI, but this is not any restriction. For example, a connecting structure similar to this embodiment can also be applied to the PCMCIA. In this case, according to the actual measurement by the present inventors, the insertion loss at 2.45 GHz was −1.7 dB if the above connecting structure was employed, whereas the insertion loss was −4.0 dB if no coplanar structure was employed. Similarly, a connecting structure similar to this embodiment can also be applied to the PCI. In this case, according to the actual measurement by the present inventors, the insertion loss at 2.45 GHz was −2.1 dB if the above connecting structure was employed, whereas the insertion loss was −5.3 dB if no coplanar structure was employed. It is seen that improvement of 2.3 to 3.2 dB is provided by using the connecting structure of this embodiment.

Although the invention made by the present inventors has been described according to the preferred embodiment of the invention, the present invention is not limited to the above embodiment, but it may be variously changed without departing from the scope of the invention.

Figure 4:
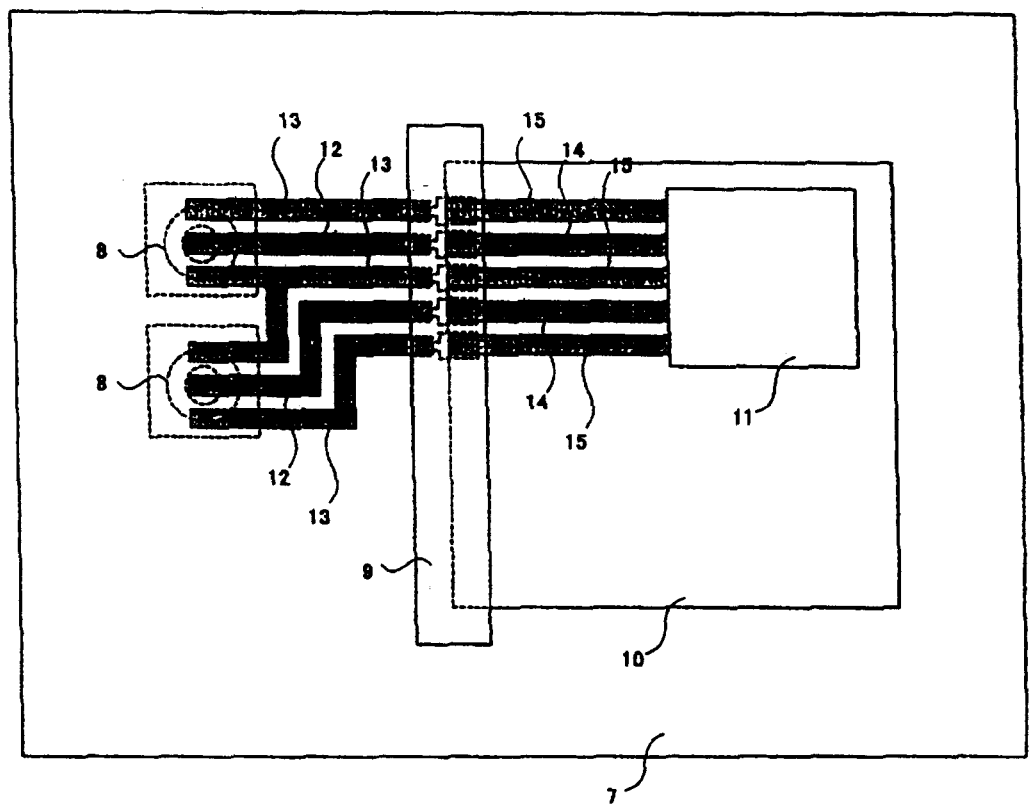
FIG. 4 is a plan view showing a further embodiment of the present invention.

For instance, as shown in FIG. 4, signal line 12 of motherboard 7 and signal line 14 of card board 10 can be provided in a multiple number. In this case, respective signal lines 12 and 14 are surrounded by ground lines 13 and 15, as shown. That is, they are alternately and repeatedly disposed, for instance, ground line, signal line, and ground line.

Figure 5:
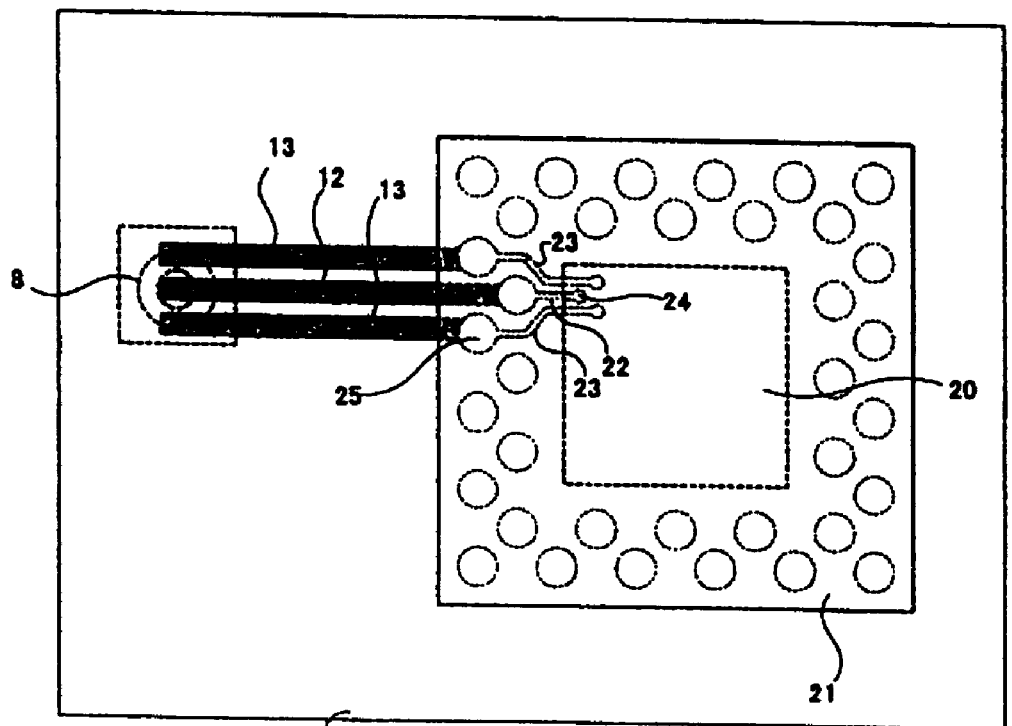
FIG. 5 is a diagram showing still a further embodiment of the present invention, in which (a) is a plan view and (b) is a cross-sectional view.
Figure 5:
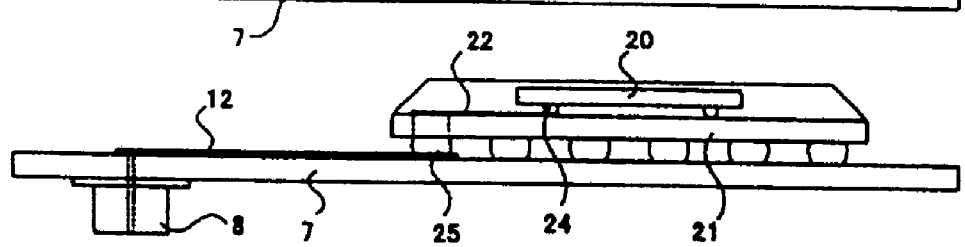
Figure 6:
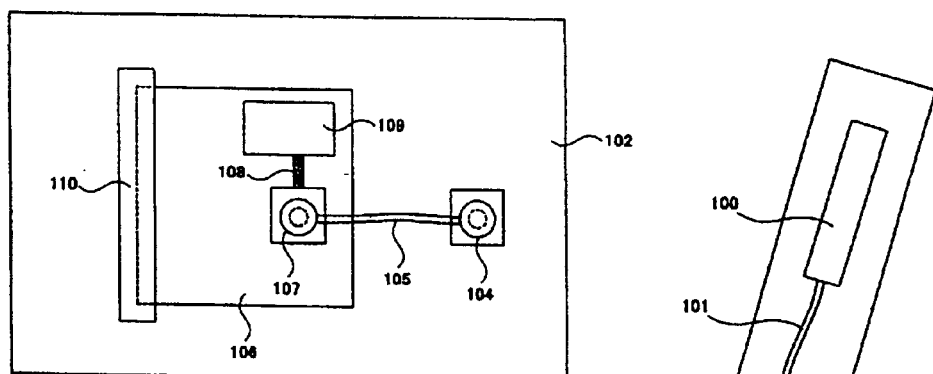
FIG. 6 is a diagram for explaining the problem involved in the connection of the wireless module and the antenna.
Figure 6:
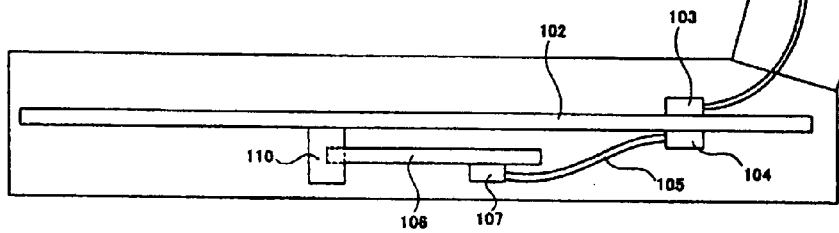
Figure 7:
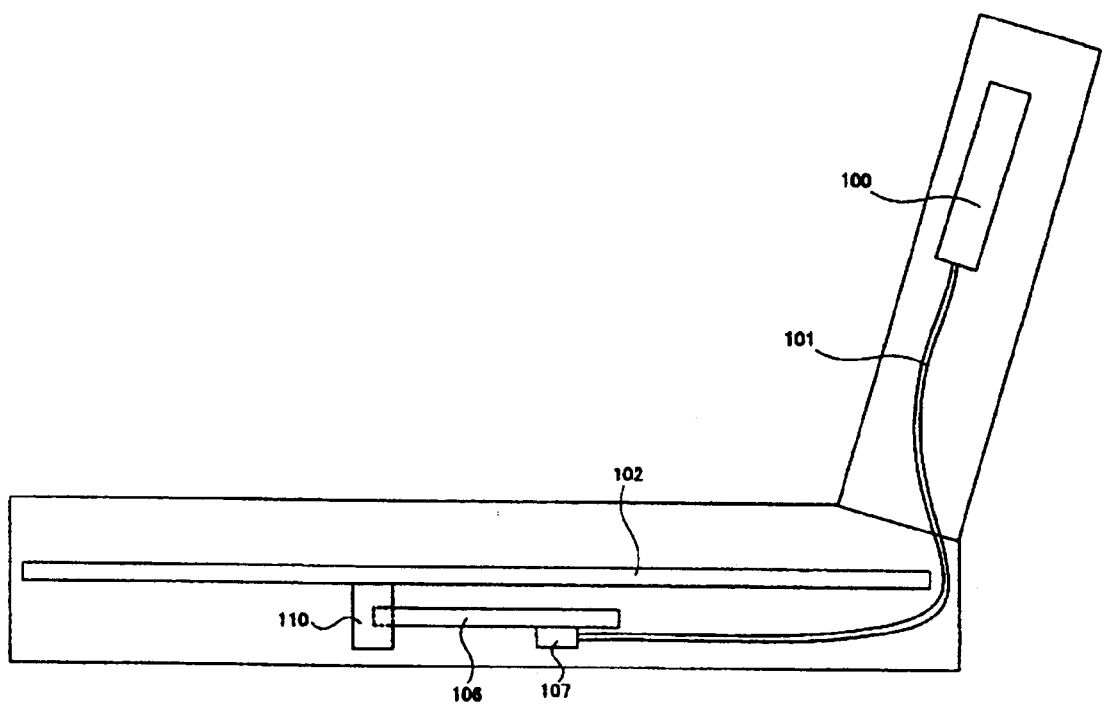
FIG. 7 is an illustration for explaining the problem occurring in the connection of the wireless module and the antenna.

Further, the present invention is not limited to the card board. For instance, as shown in FIG. 5, BGA (ball grid array) board 21 having semiconductor chip 20 can be exemplified as a board corresponding to the card board. In the wiring on BGA board 21, there are provided signal line 22 and ground lines 23, and signal line 22 is arranged so as to be surrounded by ground lines 23 in a manner similar to the above embodiment. Signal line 22 and ground lines 23 are connected to semiconductor chip 20, for instance, by gold bumps 24, and connected to signal line 12 and ground lines 13 on motherboard 7 through solder balls 25.

Further, for instance, a notebook computer has been exemplified as the computer system in the above embodiment, but the present invention can also be applied to a desk top or tower-type computer. Furthermore, it can be applied not only to a personal computer, but also to a workstation and the like. Moreover, the present invention can be applied to a PDA (personal digital assistants) or a mobile phone.

Further, a mini PCI card has been representatively exemplified as the card board, but the present invention can also be applied to other cards and even to cards which will be standardized in the future.

Further, in the above embodiments, description has been made with radio frequency mainly in a 2.4 GHz band in mind, but the present invention is not limited by radio frequency. For instance, the present invention can be applied to television signals in a 100 MHz band, radio signals for mobile phone in a 900 MHz band or a 1.5 GHz band, wireless communication in a 5 GHz band or higher frequency.

The advantage of the typical one of the inventions disclosed in this application is as follows. That is, in the expansion card standard of the existing mini PCI or the like, impedance matching performance equivalent to the connection by a coaxial connector can be provided while satisfying requirements for low cost and high workability.

What is claimed is:

1. An electronic circuit board comprising:
   a first signal line formed on a surface of said electronic circuit board;
   a first ground line and a second ground line formed on said surface, said first ground line formed adjacent a first side of said first signal line and said second ground line formed adjacent a second side of said first signal line, said first and second ground lines and said first signal line in spaced and parallel relation to each other;
   a first connector on said electronic circuit board having an opening to which a portion of a second electronic circuit board is inserted into said first connector, wherein said first signal line is connected to a second signal line on said second board through said first connector, and said first and second ground lines are connected to a third ground line and a fourth ground line respectively on the second board through said first connector; and
   a radio frequency module on said second board, wherein said second signal line is connected to a radio frequency terminal of said radio frequency module, and said third and fourth ground lines are connected to a ground terminal of said radio frequency module, further wherein said third and fourth ground lines are adjacent to a first and a second side of said signal line respectively and coplanar with said second signal line.

2. The electronic circuit board according to claim 1, wherein said portion of said second board comprises a second connector.

3. The electronic circuit board according to claim 2, comprising a plurality of first signal lines and a plurality of first and second ground lines, wherein said first signal lines and said plurality of first and second ground lines are alternately disposed.

4. The electronic circuit board according to claim 2, wherein a radio frequency signal is transmitted through said signal lines.

5. The electronic circuit board according to claim 4, comprising a coaxial receptacle on said first board, the central conductor of said coaxial receptacle being connected to said first signal line, and the outer conductors of said coaxial receptacle being connected to said first and second ground lines, wherein inserted into said coaxial receptacle is a coaxial plug at an end of a coaxial cable, the other end of which is connected to an antenna structure.

6. The electronic circuit board according to claim 5, wherein said coaxial receptacle and coaxial plug are made by a pressing process, and the height of said first board in the direction of the normal thereto is about 2.4 mm or lower when they are connected together.

7. A card for connecting to a computer, comprising:
   a board including a radio frequency module;
   a signal line formed on a surface of said board;
   a first ground line and a second ground line formed on said surface, said first ground line adjacent to a first side of said signal line and said second ground line adjacent to a second side of said signal line, said first and second ground lines coplanar with said signal line, said first and second ground lines and said signal line in spaced and parallel relation to each other, wherein said signal line is connected to a radio frequency terminal of said radio frequency module, and said first and second ground lines are connected to a ground terminal of said radio frequency module; and
   a first connector on said board for connecting to a second connector disposed on a motherboard of said computer, wherein said signal line on said board is connected to a signal line on said motherboard through said first connector, and said first and second ground lines on said board are connected to a third and fourth ground lines respectively on said motherboard through said first connector, said third and fourth ground lines are adjacent to a first and a second side of said signal line on said motherboard respectively.

8. The card according to claim 7, wherein said first connector comprises an edge terminal.

9. The card according to claim 7, comprising a plurality of signal lines and a plurality of first and second ground lines on said board, wherein said plurality of signal lines and said plurality of first and second ground lines are alternately disposed.

* * * * *